US010809829B2

(12) United States Patent
Lee et al.

(10) Patent No.: US 10,809,829 B2
(45) Date of Patent: *Oct. 20, 2020

(54) DISPLAY DEVICE WITH TOUCH SENSOR

(71) Applicant: LG Display Co., Ltd., Seoul (KR)

(72) Inventors: Jae-Won Lee, Goyang-si (KR); Seung-Hee Nam, Paju-si (KR); Min-Joo Kim, Seoul (KR); Kwon-Shik Park, Seoul (KR); Jae-Young Oh, Goyang-si (KR); Deuk-Su Lee, Goyang-si (KR); Bu-Yeol Lee, Goyang-si (KR); Eun-Hye Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/438,302

(22) Filed: Feb. 21, 2017

(65) Prior Publication Data

US 2018/0095567 A1    Apr. 5, 2018

(30) Foreign Application Priority Data

Sep. 30, 2016    (KR) .......................... 10-2016-0126760

(51) Int. Cl.
*G06F 3/041*        (2006.01)
*F21V 9/08*         (2018.01)
(Continued)

(52) U.S. Cl.
CPC .............. *G06F 3/0412* (2013.01); *F21V 9/08* (2013.01); *G06F 3/03547* (2013.01);
(Continued)

(58) Field of Classification Search
None
See application file for complete search history.

(56) References Cited

U.S. PATENT DOCUMENTS 8,970,532 B2    3/2015  Kim et al.
9,123,497 B2    9/2015  Cho et al.
(Continued)

FOREIGN PATENT DOCUMENTS

CN    101887904 A    11/2010
CN    102402323 A     4/2012
(Continued)

OTHER PUBLICATIONS

Walker, G., "Part 1: Fundamentals of Project-Capacitive Touch Technology," Jun. 1, 2014, 316 Pages, Can be retrieved at <URL:http://www.walkermobile.com/Touch_Technologies_Tutorial_Latest_Version.pdf>.

(Continued)

*Primary Examiner* — Amy Onyekaba
(74) *Attorney, Agent, or Firm* — Fenwick & West LLP

(57) ABSTRACT

Disclosed are an organic light emitting display device and a method of manufacturing the same to reduce thickness and weight. The organic light emitting display device with a touch sensor removes the necessity of an additional adhesion process by directly forming a touch sensing electrode and a touch driving electrode arranged in parallel and a color filter on an encapsulation layer covering a light emitting device, thereby simplifying a manufacturing process and reducing manufacturing costs.

19 Claims, 10 Drawing Sheets

(51) Int. Cl.
*G06F 3/0354* (2013.01)
*G06F 3/044* (2006.01)
*H01L 27/32* (2006.01)
*H01L 51/52* (2006.01)
*F21Y 115/15* (2016.01)

(52) U.S. Cl.
CPC ............ *G06F 3/044* (2013.01); *H01L 27/322* (2013.01); *H01L 27/323* (2013.01); *H01L 27/3244* (2013.01); *H01L 51/5253* (2013.01); *H01L 51/5284* (2013.01); *F21Y 2115/15* (2016.08); *G06F 2203/04103* (2013.01); *G06F 2203/04112* (2013.01); *H01L 27/3276* (2013.01); *H01L 51/524* (2013.01); *H01L 2227/323* (2013.01)

(56) References Cited

U.S. PATENT DOCUMENTS

| | | | |
|---|---|---|---|
| 9,184,409 B2 | 11/2015 | Ho-Won et al. | |
| 9,323,400 B2 | 4/2016 | Kim et al. | |
| 9,513,733 B2 | 12/2016 | Choi et al. | |
| 9,535,523 B2 | 1/2017 | Kim et al. | |
| 9,715,313 B2 | 7/2017 | Ye et al. | |
| 9,851,840 B2* | 12/2017 | Hwang | G06F 3/0412 |
| 10,013,088 B2 | 7/2018 | Kim et al. | |
| 10,474,270 B2 | 11/2019 | Kim et al. | |
| 2006/0231848 A1 | 10/2006 | Fu | |
| 2008/0278070 A1 | 11/2008 | Kim | |
| 2010/0097296 A1* | 4/2010 | Wang | H01L 27/3253 345/32 |
| 2010/0136868 A1* | 6/2010 | Chien | G06F 3/0412 445/24 |
| 2012/0062481 A1 | 3/2012 | Kim et al. | |
| 2012/0105344 A1* | 5/2012 | Ko | G06F 3/0412 345/173 |
| 2012/0319974 A1* | 12/2012 | Kim | G06F 3/044 345/173 |
| 2013/0081869 A1* | 4/2013 | Kim | G06F 3/044 174/261 |
| 2013/0257774 A1 | 10/2013 | Kim et al. | |
| 2014/0062916 A1* | 3/2014 | Hong | G06F 3/0416 345/173 |
| 2014/0069796 A1 | 3/2014 | Kang et al. | |
| 2014/0098305 A1* | 4/2014 | Mo | G02F 1/13338 349/12 |
| 2014/0117324 A1* | 5/2014 | Kim | H01L 27/322 257/40 |
| 2014/0132488 A1* | 5/2014 | Kim | G06F 1/1637 345/76 |
| 2014/0139481 A1* | 5/2014 | Han | G06F 3/044 345/174 |
| 2014/0152912 A1* | 6/2014 | Lee | G06F 3/0412 349/12 |
| 2014/0160047 A1 | 6/2014 | Choi et al. | |
| 2014/0160066 A1 | 6/2014 | Kim et al. | |
| 2014/0160072 A1* | 6/2014 | Inagaki | G06F 3/0418 345/174 |
| 2014/0160376 A1* | 6/2014 | Wang | G02F 1/1343 349/12 |
| 2014/0183478 A1* | 7/2014 | Lee | H01L 51/5246 257/40 |
| 2014/0184937 A1* | 7/2014 | Lim | G06F 3/044 349/12 |
| 2014/0198268 A1* | 7/2014 | Sugita | G06F 3/0412 349/12 |
| 2014/0232956 A1* | 8/2014 | Kwon | G02F 1/133305 349/12 |
| 2014/0313435 A1* | 10/2014 | Cho | G06F 3/044 349/12 |
| 2014/0320759 A1* | 10/2014 | Jeong | G06F 1/1692 349/12 |
| 2015/0062465 A1* | 3/2015 | Her | G06F 3/044 349/12 |
| 2015/0084912 A1* | 3/2015 | Seo | G06F 3/0412 345/174 |
| 2015/0144909 A1* | 5/2015 | Byun | H01L 51/5253 257/40 |
| 2015/0160767 A1* | 6/2015 | Song | G06F 3/0412 345/174 |
| 2015/0185928 A1* | 7/2015 | Son | G06F 3/016 345/174 |
| 2015/0185942 A1* | 7/2015 | Kim | G06F 3/0412 345/173 |
| 2015/0185960 A1* | 7/2015 | Kim | G06F 3/044 345/175 |
| 2015/0199049 A1* | 7/2015 | Yang | H01L 27/323 345/174 |
| 2015/0227239 A1* | 8/2015 | Kim | G06F 3/0412 345/174 |
| 2015/0370356 A1* | 12/2015 | Hwang | G06F 3/041 345/173 |
| 2015/0378486 A1* | 12/2015 | Yu | G06F 3/0412 345/174 |
| 2015/0380467 A1 | 12/2015 | Su | |
| 2016/0093827 A1* | 3/2016 | Han | H01L 27/3244 257/40 |
| 2016/0103537 A1 | 4/2016 | Park et al. | |
| 2016/0117031 A1* | 4/2016 | Han | G06F 3/0412 345/174 |
| 2016/0124557 A1* | 5/2016 | Choi | G06F 1/1626 345/173 |
| 2016/0126498 A1* | 5/2016 | Kim | H01L 51/5234 257/40 |
| 2016/0139705 A1* | 5/2016 | Park | G06F 3/044 345/174 |
| 2016/0155786 A1* | 6/2016 | Park | H01L 27/322 257/40 |
| 2016/0170524 A1* | 6/2016 | Kim | G06F 3/044 345/174 |
| 2016/0174376 A1* | 6/2016 | Oh | H05K 1/111 361/749 |
| 2016/0179229 A1* | 6/2016 | Ahn | H01L 27/323 345/173 |
| 2016/0181345 A1* | 6/2016 | Lee | H01L 27/3276 257/40 |
| 2016/0209971 A1* | 7/2016 | Kim | G06F 3/044 |
| 2016/0231846 A1 | 8/2016 | Kim et al. | |
| 2016/0260780 A1* | 9/2016 | Kim | H01L 51/0097 |
| 2016/0378224 A1* | 12/2016 | Kwon | H01L 27/322 345/174 |
| 2017/0075491 A1* | 3/2017 | Ye | G06F 3/0412 |
| 2017/0262109 A1* | 9/2017 | Choi | G06F 3/0412 |
| 2017/0308196 A1* | 10/2017 | Jeong | H01L 27/3244 |
| 2017/0308199 A1* | 10/2017 | Liu | H01L 51/5253 |
| 2018/0018034 A1* | 1/2018 | Choi | G06F 1/1692 |
| 2018/0033832 A1* | 2/2018 | Park | H01L 51/107 |
| 2018/0039360 A1* | 2/2018 | Akimoto | H01L 51/5218 |
| 2018/0040672 A1* | 2/2018 | Park | G06F 1/1652 |
| 2018/0292936 A1 | 10/2018 | Kim et al. | |
| 2020/0073502 A1 | 3/2020 | Kim et al. | |

FOREIGN PATENT DOCUMENTS

| | | |
|---|---|---|
| CN | 103365461 A | 10/2013 |
| CN | 103870056 A | 6/2014 |
| CN | 103872081 A | 6/2014 |
| CN | 104111748 A | 10/2014 |
| CN | 104793825 A | 7/2015 |
| KR | 20120042438 | 5/2012 |
| KR | 10-2014-0022223 A | 2/2014 |
| KR | 20140113541 | 9/2014 |
| KR | 20160106825 | 9/2016 |
| TW | 201135556 | 10/2011 |
| TW | 201314528 A | 4/2013 |
| TW | I452690 | 9/2014 |

(56) References Cited

FOREIGN PATENT DOCUMENTS

TW    201531905    8/2015
TW    201627844    8/2016

OTHER PUBLICATIONS

Extended European Search Report for European Patent Application No. EP 17156042.8, dated Aug. 21, 2017, 12 Pages.
Office Action for Korean Patent Application No. KR 10-2016-0126760, dated Dec. 13, 2017, 8 Pages, (With Concise Explanation of Relevance).
Office Action for Taiwan Patent Application No. TW 10720009630, dated Jan. 4, 2018, 17 Pages, (With English Translation).
Korean Intellectual Property Office, Office Action, KR Patent Application No. 10-2016-0126761, dated Jun. 14, 2018, eight pages (with concise explanation of relevance).
Taiwan Intellectual Property Office, Office Action, TW Patent Application No. 106105297, dated Mar. 9, 2020, eight pages.
European Patent Office, Communication pursuant to Article 94(3) EPC, EP Patent Application No. 17156042.8, dated Jan. 17, 2020, ten pages.
China National Intellectual Property Administration, First Notification of Office Action, CN Patent Application No. 201710072738.2, dated May 8, 2020, 19 pages.

\* cited by examiner

DISPLAY DEVICE WITH TOUCH SENSOR

CROSS REFERENCE TO RELATED APPLICATIONS

This application claims the benefit of Korean Patent Application No. 10-2016-0126760, filed on Sep. 30, 2016, which is hereby incorporated by reference as if fully set forth herein.

BACKGROUND

Field

An embodiment of the present disclosure relates to an organic light emitting display device with a touch sensor and a method of manufacturing the same, and more particularly, to an organic light emitting display device with a touch sensor and a method of manufacturing the same to simplify a manufacturing process and reduce manufacturing costs.

Discussion of the Related Art

A touchscreen is a device for inputting a user's command by selecting an instruction shown on a screen of a display or the like with the hand of the user or an object. That is, the touchscreen converts a contact position thereof that directly contacts the hand of the user or the object into an electrical signal and receives the instruction selected in the contact position as an input signal. Such a touchscreen can replace an additional input device such as a keyboard or mouse which is operated in connection with a display and application thereof is thus gradually expanding.

In general, such a touchscreen is often attached to the front surface of a display panel such as a liquid crystal display panel or an organic electroluminescent display panel through an adhesive agent. In this case, there are problems of complicated overall process and increased costs resulting from an additional attachment process, because the touchscreen is separately produced and is attached to the front surface of the display panel.

SUMMARY

Accordingly, an embodiment of the present disclosure is an organic light emitting display device with a touch sensor and a method of manufacturing the same that substantially obviate one or more problems due to limitations and disadvantages of the related art.

An embodiment of the present disclosure provides an organic light emitting display device with a touch sensor and a method of manufacturing the same to simplify a manufacturing process and reduce manufacturing costs.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In one embodiment, an organic light emitting display device with a touch sensor removes the necessity of an additional adhesion process by directly disposing a touch sensing electrode and a touch driving electrode in parallel and a color filter on an encapsulation layer disposed to cover a light emitting device, thereby simplifying the manufacturing process and reducing manufacturing costs.

In one embodiment, a display device comprises at least one light emitting device disposed on a substrate. An encapsulation layer is disposed on the at least one light emitting device. An insulating layer is between the substrate and the encapsulation layer. A touch sensor comprises a plurality of touch sensing electrodes on the encapsulation layer, the plurality of touch sensing electrodes disposed along a first direction. The touch sensor also includes a plurality of touch driving electrodes on the encapsulation layer and in a same plane as the plurality of touch sensing electrodes. The plurality of touch driving electrodes are disposed along the first direction and are in parallel with the plurality of touch sensing electrodes. A touch pad is electrically connected to the touch sensor and is in contact with the insulating layer.

In one embodiment, a display device comprises at least one light emitting device disposed on a substrate. An encapsulation layer is disposed on the at least one light emitting device. A touch sensor of the display comprises a plurality of touch sensing electrodes on the encapsulation layer, the plurality of touch sensing electrodes disposed along a first direction. The touch sensor also comprises a plurality of touch driving electrodes on the encapsulation layer and in a same plane as the plurality of touch sensing electrodes. The plurality of touch driving electrodes are disposed along the first direction and are in parallel with the plurality of touch sensing electrodes. A routing line is electrically connected to the touch sensor and the routing line covers a side surface of the encapsulation layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being "on" or "under" another element, not only can it be directly on or under another element, but it can also be indirectly on or under another element via an intervening element.

Hereinafter, embodiments of the present disclosure will be described with reference to the annexed drawings in detail.

Figure 1:
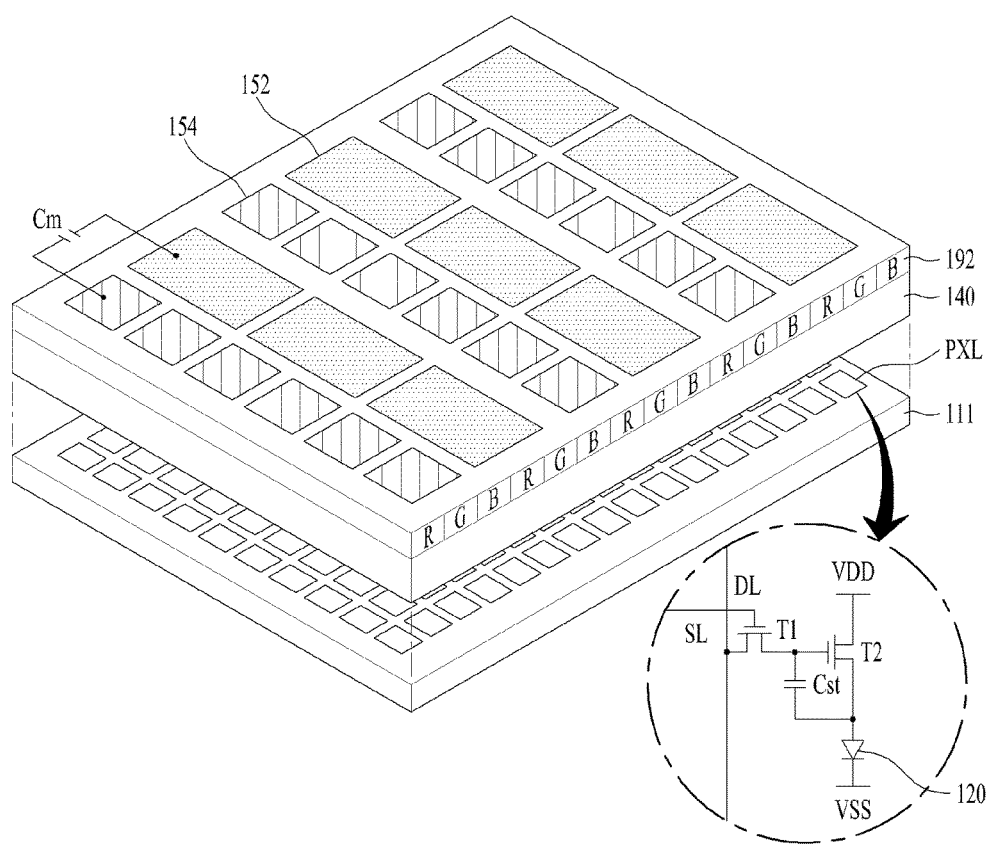
FIG. 1 is a perspective view illustrating an organic light emitting display device with a touch sensor according to a first embodiment of the present disclosure.
Figure 2:
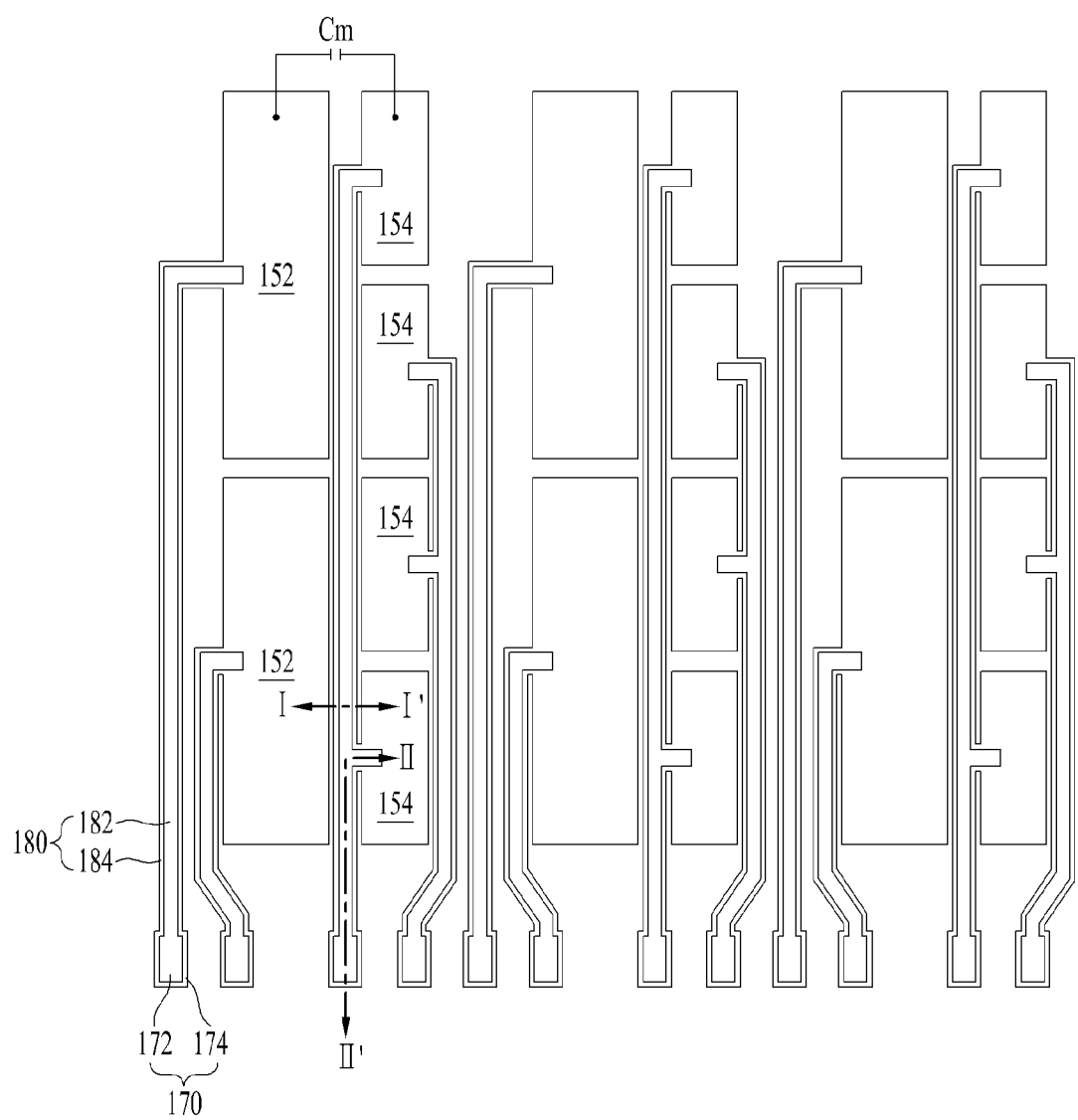
FIG. 2 is a plan view illustrating the organic light emitting display device with a touch sensor shown in FIG. 1.

FIGS. 1 and 2 are a perspective view and a plan view illustrating an organic light emitting display device with a touch sensor according to the present disclosure, respectively.

The organic light emitting display device with a touch sensor illustrated in FIGS. 1 and 2 detects variation in mutual capacitance (Cm) by touch of a user through touch electrodes 152 and 154 during a touch period to sense presence of touch and position thereof. In addition, the organic light emitting display device with a touch sensor displays an image through a unit pixel including a light emitting device 120 during a display period. The unit pixel includes red (R), green (R) and blue (B) sub-pixels (PXL), or red (R), green (R), blue (B) and white (W) sub-pixels (PXL).

For this purpose, the organic light emitting display device shown in FIG. 1 includes a plurality of sub-pixels (PXL) disposed in the form of a matrix on a substrate 111, a encapsulation layer 140 disposed on the sub-pixels (PXL), and a touch sensor and a color filter 192 disposed on the encapsulation layer 140. The color filter 192 can be a single color filter layer that includes red R portions, green G portions and blue B portions.

Each of the sub-pixels (PXL) includes a pixel driving circuit and a light emitting device 120 connected to the pixel driving circuit.

The pixel driving circuit includes a switching transistor (T1), a driving transistor (T2) and a storage capacitor (Cst).

The switching transistor (T1) is turned on when a scan pulse is supplied to a scan line (SL) and supplies a data signal supplied to a data line (DL) to the storage capacitor (Cst) and a gate electrode of the driving transistor (T2).

In response to the data signal supplied to the gate electrode of the driving transistor (T2), the driving transistor (T2) controls a current (I) supplied from a high-voltage power (VDD) line to the light emitting device 120, thereby regulating the amount of light emitted by the light emitting device 120. In addition, although the switching transistor (T1) is turned off, the driving transistor (T2) supplies a predetermined current (I) by the voltage charged in the storage capacitor (Cst) until a data signal of the next frame is supplied, thereby maintaining light emission of the light emitting device 120.

Figure 3:
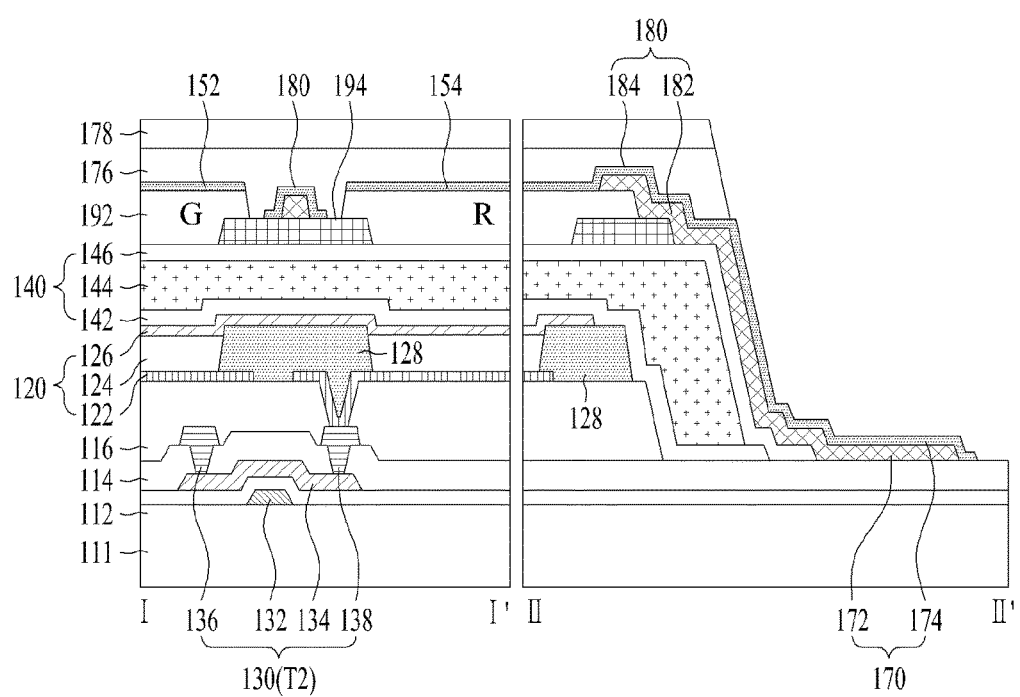
FIG. 3 is a sectional view illustrating the organic light emitting display device with a touch sensor taken along lines "I-I'" and "II-II'" of FIG. 2.

As illustrated in FIG. 3, the driving transistors (T2) 130 include a gate electrode 132, a semiconductor layer 134 overlapping the gate electrode 132 via a gate insulation layer 112, and source and drain electrodes 136 and 138 formed on the protective insulation layer 114 and contacting the semiconductor layer 134.

The light emitting device 120 includes an anode 122, at least one light emitting stack 124 formed on the anode 122, and a cathode 126 formed on the light emitting stack 124. In one embodiment, the light emitting device 120 is an organic light emitting diode (OLED) that converts electric energy into light.

The anode 122 is electrically connected to a drain electrode 138 of the driving transistor 130 exposed through a pixel contact hole passing through a planarization film 116. The light emitting stack 124 is formed on the anode 122 of a light emission region provided by a bank 128. Each of at least one light emitting stack 124 is formed by stacking a hole-related layer, an organic light emitting layer and an electron-related layer in order or reverse order and generates white light incident upon the color filter 192. For example, the light emitting stack 124 includes first and second light emitting stacks facing each other via a charge generation layer. In this case, any one light emitting layer of the first and second light emitting stacks generates blue light, and the other light emitting layer of the first and second light emitting stacks generates yellow-green light, thereby generating white light through the first and second light emitting stacks. The cathode 126 faces the anode 122 via the light emitting stack 124.

The encapsulation layer 140 blocks permeation of exterior moisture or oxygen to the light emitting device 120 that is vulnerable thereto. For this purpose, the encapsulation layer 140 includes a plurality of inorganic encapsulation layers 142 and 146, and an organic encapsulation layer 144 interposed between the inorganic encapsulation layers 142 and 146, wherein the inorganic encapsulation layer 146 is disposed as an uppermost layer. In this case, the encapsulation layer 140 includes at least two inorganic encapsulation layers 142 and 146, and at least one organic encapsulation layer 144. An example of the encapsulation layer 140 having a structure in which the organic encapsulation layer 144 is disposed between the first and second inorganic encapsulation layers 142 and 146 will be described.

The first inorganic encapsulation layer 142 is formed on the substrate 111 provided with the cathode 126 such that it is the closest to the light emitting device 120. The first inorganic encapsulation layer 142 is formed using an inorganic insulating material that can be deposited at a low temperature, such as silicon nitride ($SiN_x$), silicon oxide ($SiO_x$), silicon oxynitride (SiON) or aluminum oxide ($Al_2O_3$). Accordingly, since the first inorganic encapsulation layer 142 is deposited at a low temperature, it is possible to prevent damage to the organic light emitting layer of the light emitting stack 124 vulnerable to high temperatures upon deposition of the first inorganic encapsulation layer 142.

The organic encapsulation layer 144 functions as a buffer reducing stress between the respective layers resulting from the bending of the organic light emitting display device and improves planarization performance. The organic encapsulation layer 144 is formed using an organic insulating material such as an acrylic resin, an epoxy resin, polyimide, polyethylene or silicon oxycarbide (SiOC).

The second inorganic encapsulation layer 146 is formed on the substrate 111 provided with the organic encapsulation layer 144 such that it covers the upper and side surfaces of each of the organic encapsulation layer 144 and the first inorganic encapsulation layer 142. Accordingly, the second inorganic encapsulation layer 146 minimizes or prevents permeation of exterior moisture or oxygen into the first inorganic encapsulation layer 142 and the organic encapsulation layer 144. The second inorganic encapsulation layer 146 is formed using an inorganic insulating material such as silicon nitride ($SiN_x$), silicon oxide ($SiO_x$), silicon oxynitride (SiON) or aluminum oxide ($Al_2O_3$).

The color filter 192 and the touch sensor are disposed on the encapsulation layer 140. The color filter 192 is between the encapsulation layer 140 and the touch sensor (e.g. 152 and 154).

The color filter 192 is directly disposed on the encapsulation layer 140 such that it overlaps the light emitting region defined by the bank 128. Accordingly, white light generated in the light emitting device 120 is emitted through the color filter 192 to realize a color image. Meanwhile, the color filter 192 is formed using a material that can be produced at a low temperature (about 100 degrees Celsius or less) to protect the light emitting stack 124, which is vulnerable to high temperatures.

The color filter 192 is directly disposed on and contacts the encapsulation layer 140 covering the light emitting devices 120. In this case, since the color filter 192 and the light emitting devices 120 are disposed on the same substrate 111, the present disclosure does not need an additional joining process, thus simplifying the overall process and reducing manufacturing costs. On the other hand, since a related organic light emitting display device has a structure in which the color filter 192 and the light emitting devices 120 are disposed on different substrates, it needs a process of joining a substrate provided with the color filter 192 to a substrate provided with the light emitting devices 120, thus having problems of increased process complexity and manufacturing costs.

As such, a black matrix 194 is disposed between individual sub-pixel regions of the color filter 192 according to the present disclosure to divide respective sub-pixel regions and prevent light interference between adjacent sub-pixel regions and light leakage. In this case, the black matrix 194 overlaps the bank 128 between the sub-pixel regions. The black matrix 194 is formed using a high-resistance black insulating material or is formed by stacking at least two color filters among red (R), green (R) and blue (B) color filters 192.

A touch sensor, which includes a plurality of touch sensing electrodes 152 and a plurality of touch driving electrodes 154 disposed in parallel with the touch sensing electrodes 152, is disposed on the substrate 111 provided with the color filter 192 and the black matrix 194. For example, the touch sensing electrodes 152 and the touch driving electrodes 154 are disposed in parallel on the color filter 192. The touch sensing electrode 152 and the touch driving electrode 154 are in the same plane.

The touch sensing electrodes 152 are shaped as blocks and are spaced from one another by a predetermined distance in a predetermined direction (e.g. in both the vertical and horizontal directions). The touch sensing electrodes 152 can be divided into groups. Each group of touch sensing electrodes 152 is organized along the vertical direction into a vertical line. The touch sensing electrodes 152 are also located on the color filter 192 and the black matrix 194, or the color filter 192.

The touch driving electrodes 154 are shaped as blocks and are spaced from one another by a predetermined distance. The touch driving electrodes 154 can be divided into groups.

Each group of touch driving electrodes 154 is organized along the vertical direction into a vertical line. As a result, groups of touch sensing electrodes 152 are parallel to groups of touch driving electrodes 154. The touch sensing and touch driving electrodes 152 and 154 are on the color filter 192 and the black matrix 194, or the color filter 192. In this case, each of the touch driving electrodes 154 has a smaller area than each of the touch sensing electrodes 152. Accordingly, one of the touch sensing electrodes 152 corresponds to N (in which N is a natural number greater than 1) touch driving electrodes of the touch driving electrodes 154.

As such, a mutual capacitance (Cm) is formed between the touch sensing electrode 152 and the touch driving electrode 154. The mutual capacitance (Cm) is charged with an electric charge by a touch driving pulse supplied to the touch driving electrode 154 and the electric charge is discharged to the touch sensing electrode 152.

Meanwhile, the touch driving electrodes 154 and the touch sensing electrodes 152 according to the present disclosure are connected to a touch driving part (not shown) through a plurality of routing lines 180 and a touch pad 170 disposed between the touch driving electrodes 154 and the touch sensing electrodes 152.

Accordingly, the routing lines 180 transmit a touch driving pulse generated in the touch driving part through the touch pad 170 to the touch driving electrode 154, and transmit a touch sensing signal from the touch sensing electrode 152 to the touch pad 170. For this purpose, each of the routing lines 180 is disposed to connect each of the touch driving electrode 154 and the touch sensing electrode 152, and the touch pad 170, and is electrically connected to each of the touch driving electrode 154 and the touch sensing electrode 152, without an additional contact hole.

As shown in FIG. 3, the routing line 180 slopes downwards at an angle towards the substrate 111 and touch pad 170. The sloped portion of the routing line at least partially covers a side surface of the encapsulation layer 140 and is in direct contact with the side surface of the encapsulation layer 140. The routing line 180 also has a stepped shape that follows the shape of the underlying layers that the routing line 180 is in contact with.

The routing line 180 is formed as a monolayer or multilayer structure using a first conductive layer with excellent corrosion resistance, acid resistance and conductivity, such as Al, Ti, Cu or Mo. For example, the routing line is formed as a three-layer stack structure such as Ti/Al/Ti or Mo/Al/Mo. Alternatively, as shown in FIG. 3, the routing line 180 is formed as a stack structure in which first and second routing layers 182 and 184 are stacked. The first routing layer 182 is formed as a first conductive layer with excellent corrosion resistance, acid resistance and conductivity such as Al, Ti, Cu or Mo, and the second routing layer 184 is formed as a second conductive layer with excellent corrosion resistance and acid resistance such as ITO or IZO that is the same material as the touch driving electrode 154 and the touch sensing electrode 152.

The touch pad 170 is in a non-display area of the display device and is electrically connected to the touch sensor (e.g. 154 and 152) via the routing line 180. The touch pad 170 includes a pad electrode 172, and a pad cover electrode 174 formed on the pad electrode 172 such that the pad cover electrode 174 covers the pad electrode 172. The pad electrode 172 is in direct contact with the protective insulation layer 114. In some embodiments, the pad electrode 172 may be in direct contact with the gate insulation layer 112. The gate insulation layer 112 and protective insulation layer 114 are both located between the substrate 111 and the encapsulation layer 140.

The pad electrode 172 extends from the routing line 180 and is formed using the same material as the first routing layer 182 of the routing line 180. The pad cover electrode 174 is formed as a second conductive layer with excellent corrosion resistance and acid resistance such as ITO or IZO that is the same material as the touch driving electrode 154 and the touch sensing electrode 152. The pad cover electrode 174 is formed to be exposed by the touch barrier film 176 and is thus connected to a signal transmission film provided with a touch driving part.

Here, the touch barrier film 176 is formed to cover the touch sensing electrode 152 and the touch driving electrode 154, thereby preventing damage to the light emitting device 120 as well as the touch sensing electrode 152 and the touch driving electrode 154 by exterior moisture or the like. The touch barrier film 176 is formed by coating an organic insulating film with an inorganic insulating film. An optical film 178 such as a circular polarizer or brightness improvement film (OLED transmittance controllable film, OTF) may be disposed on the touch barrier film 176.

As such, the organic light emitting display device with a touch sensor according to the first embodiment of the present disclosure has a structure in which the touch sensing electrode 152 and the touch driving electrode 154 are formed on the encapsulation layer 140 during manufacturing of the display. Accordingly, as compared to a related organic light emitting display device in which a touchscreen is directly attached to the organic light emitting display device by an adhesive agent, the present disclosure does not require an adhesion process, thus simplifying the manufacturing process and reducing manufacturing costs.

All the layers shown in FIG. 3 as formed on a single substrate 111. In one embodiment, substrate 111 may be the only substrate in the display device.

Figure 4:
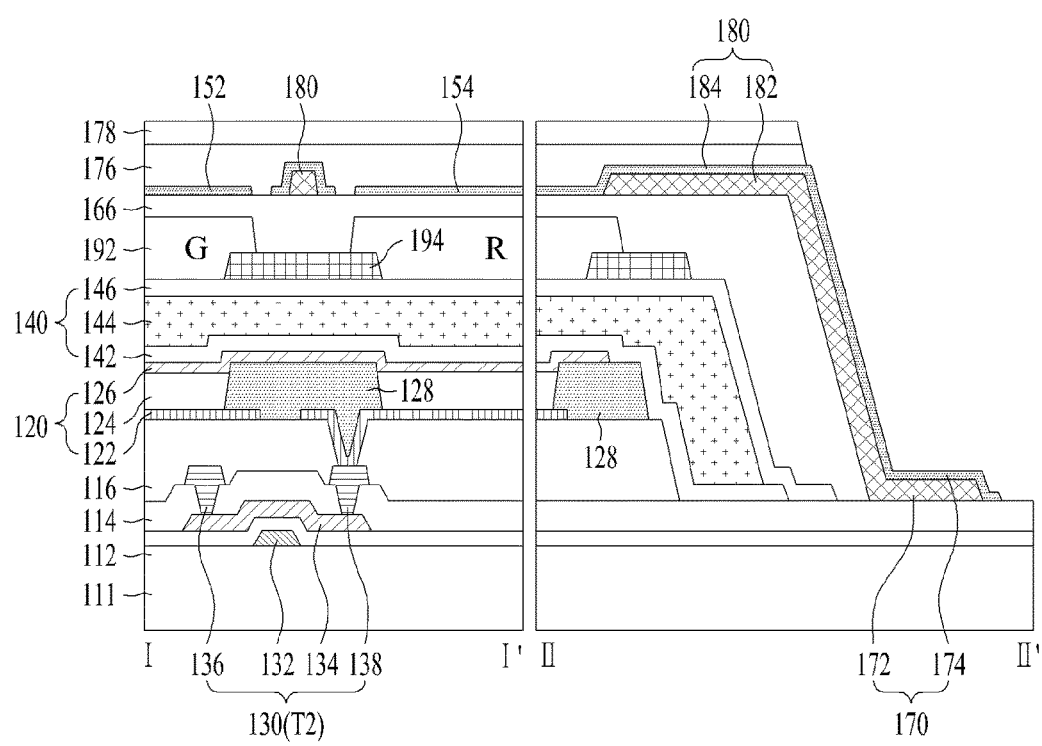
FIG. 4 is a sectional view illustrating an organic light emitting display device with a touch sensor according to a second embodiment of the present disclosure.

FIG. 4 is a sectional view illustrating an organic light emitting display device with a touch sensor according to a second embodiment of the present disclosure.

The organic light emitting display device with a touch sensor illustrated in FIG. 4 includes the same elements as the organic light emitting display device illustrated in FIG. 3, except that the touch driving electrode 154 and the touch sensing electrode 152 are disposed on a touch buffer layer 166. The touch driving electrode 154 and the touch sensing electrode 152 are in a same plane. Accordingly, detailed description of the same elements will be omitted.

The touch buffer layer 166 is formed on the color filter 192 and the black matrix 194 so as to cover the color filter 192 and the black matrix 194. The touch sensing electrode 152, the touch driving electrode 154 and the routing line 180 are formed on the touch buffer layer 166. The location of the touch buffer layer 166 causes it to be between the touch electrodes 152 and 154 and lower layers such as the color filter 192 and encapsulation layer 140.

In this case, the touch buffer layer 166 is formed to have a thickness of about 500 Å to 5 µm to maintain the distance between each of the touch sensing electrode 152 and the touch driving electrode 154, and the cathode 126 at 5 µm or more. Accordingly, the capacitance of a parasitic capacitor formed between each of the touch driving electrode 154 and the touch sensing electrode 152, and the cathode 126 can be minimized and mutual capacitive effect caused by capacitive coupling between each of the touch driving electrode 154 and the touch sensing electrode 152, and the cathode 126 can thus be prevented. Meanwhile, when the distance between each of the touch driving electrode 154 and the touch sensing electrode 152, and the cathode 126 is less than 5 µm, touch performance is deteriorated due to mutual capacitive effect caused by capacitive coupling between each of the touch driving electrode 154 and the touch sensing electrode 152, and the cathode 126.

In addition, the touch buffer layer 166 prevents permeation of a reagent (such as a developing solution or etching solution) used for manufacturing the touch driving electrode 154 and the touch sensing electrode 152 or exterior moisture from penetrating into the light emitting stack 124. Accordingly, the light emitting stack 124, which is vulnerable to the reagent or moisture, is protected by the touch buffer layer 166 and damage to the light emitting stack 124 can be prevented.

In order to prevent damage to the light emitting stack 124, which is vulnerable to high temperatures, the touch buffer layer 166 can be formed using an organic insulating material which can be formed at a low temperature of 100 degrees Celsius (° C.) or less and has a low dielectric constant of 1 to 3. For example, the touch buffer layer 166 is formed using an acrylic, epoxy or siloxane material. The touch buffer layer 166 prevents damage to the respective encapsulation layers 142, 144 and 146 inside the encapsulation layer 140, resulting from bending of the organic light emitting display device, and also prevents breakage of the touch sensing electrode 152 and the touch driving electrode 154 formed on the touch buffer layer 166. The touch buffer layer 166 also serves as a planarization layer.

Additionally, the routing line 180 at least partially covers both the side surface of the encapsulation layer 140 and the side surface of the touch buffer layer 166. The sloped portion of the routing line 180 extends downwards along the side surface of the touch buffer layer 166, and is in direct contact with the side surface of the touch buffer layer 166.

As such, the organic light emitting display device with a touch sensor according to the second embodiment of the present disclosure has a structure in which the touch sensing and driving electrodes 152 and 154 are formed on the encapsulation layer 140 during manufacturing of the display. Accordingly, as compared to a related organic light emitting display device in which the touchscreen is attached to the organic light emitting display device by an adhesive agent, the present disclosure does not require an adhesion process, thus simplifying the manufacturing process and reducing manufacturing costs.

In addition, the organic light emitting display device with a touch sensor according to the second embodiment of the present disclosure has a structure in which the touch driving electrode 154 and the touch sensing electrode 152 are disposed on a touch buffer layer 166, thus preventing damage to the light emitting stack 124 and reducing the capacitance of the parasitic capacitor formed by each of the touch driving electrode 154 and the touch sensing electrode 152 and the cathode 126.

Figure 5:
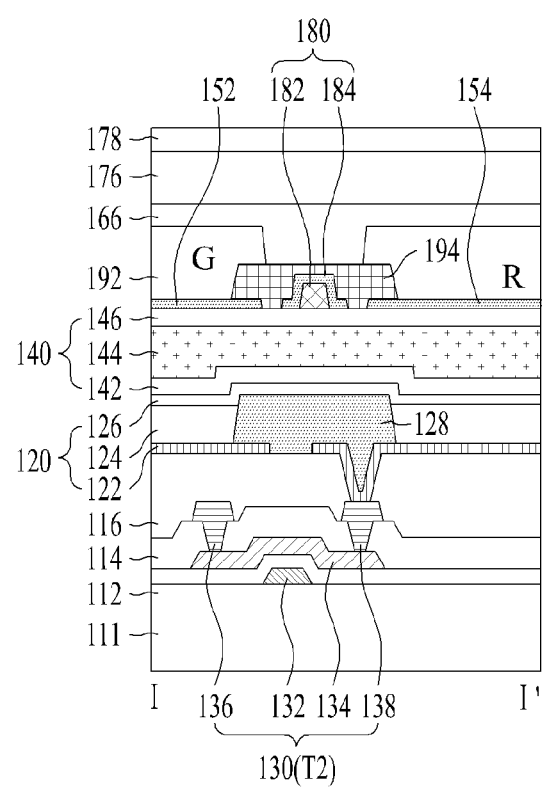
FIG. 5 is a sectional view illustrating an organic light emitting display device with a touch sensor according to a third embodiment of the present disclosure.

FIG. 5 is a sectional view illustrating an organic light emitting display device with a touch sensor according to a third embodiment of the present disclosure.

The organic light emitting display device illustrated in FIG. 5 includes the same elements as the organic light emitting display device illustrated in FIG. 4, except that the touch driving electrode 154 and the touch sensing electrode 152 are disposed in parallel on the second inorganic encapsulation layer 146, which is the uppermost layer of the encapsulation layer 140. Accordingly, detailed description of the same elements will be omitted.

The color filter 192 and the black matrix 194 illustrated in FIG. 5 cover the touch sensor. That is, the touch driving electrode 154 and the touch sensing electrode 152 included in the touch sensor are disposed between the color filter 192 and the encapsulation layer 140. In this case, the color filter 192 and the black matrix 194, which are disposed higher than the touch sensor, absorb exterior light incident from the outside of the organic light emitting display device to the inside thereof. That is, it is possible to prevent reflection of exterior light by conductive layers (for example, bridges (not shown), an anode 122, a gate electrode 132, and source and drain electrodes 136 and 138) formed using a metal with high reflectivity included in the touch sensor, the light emitting device 120 and the transistor 130, and thus deterioration of visibility by exterior light. Accordingly, the organic light emitting display device shown in FIG. 5 can prevent deterioration of visibility due to exterior light even without an additional circular polarizer, and can thus reduce costs owing to removal of the circular polarizer.

In addition, the touch buffer layer 166 is formed on the substrate 111 provided with the color filter 192 and the black matrix 194. The touch buffer layer 166 is formed using an organic insulating material such as an acrylic resin, an epoxy resin, polyimide, polyethylene or silicon oxycarbide (SiOC). The touch buffer layer 166 formed using the organic insulating material planarizes the substrate 111 provided with the color filter 192 and the black matrix 194, thus improving adhesion of the barrier film 176 and the optical film 178 to the touch buffer layer 166.

As such, the organic light emitting display device with a touch sensor according to the third embodiment of the present disclosure has a structure in which the touch driving electrode 154 and the touch sensing electrode 152 are directly disposed on the encapsulation layer 140. Accordingly, as compared to a conventional organic light emitting display device in which the touchscreen is attached to the organic light emitting display device by an adhesive agent, the present disclosure does not require an adhesion process, thus simplifying the manufacturing process and reducing manufacturing costs.

In addition, the organic light emitting display device with a touch sensor according to the present disclosure has a structure in which the color filter 192 is formed on the encapsulation layer 140 during manufacturing of the display. Accordingly, the present disclosure does not require a joining material, thus securing spaces corresponding to joining alignment vacancy and joining material thickness, and improving resolution and opening ratio.

Additionally, the organic light emitting display device with a touch sensor according to the present disclosure absorbs exterior light through the color filter 192 and the black matrix 194 covering the light emitting device 120 and the touch sensor, thus preventing deterioration of visibility due to exterior light.

Figure 6:
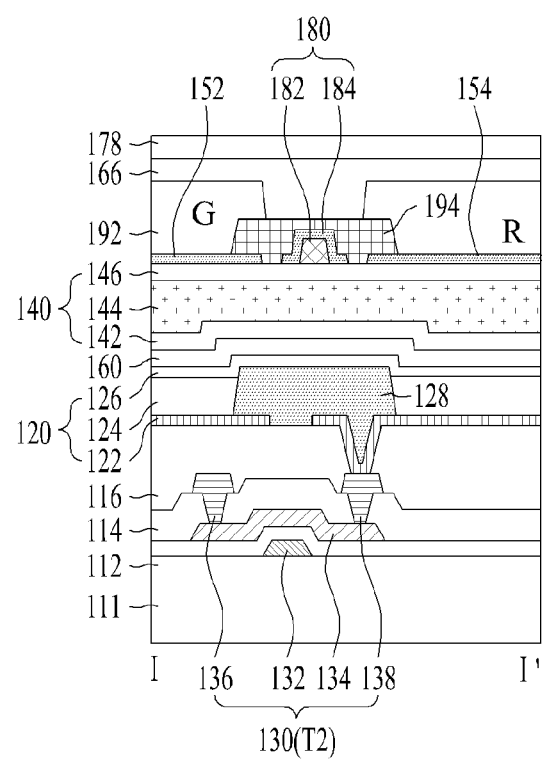
FIG. 6 is a sectional view illustrating an organic light emitting display device with a touch sensor according to a fourth embodiment of the present disclosure.

FIG. 6 is a sectional view illustrating an organic light emitting display device with a touch sensor according to a fourth embodiment of the present disclosure.

The organic light emitting display device illustrated in FIG. 6 includes the same elements as the organic light emitting display device illustrated in FIG. 5, except that the touch barrier film 176 is omitted and a barrier thin film layer 160 is provided. Accordingly, detailed description of the same elements will be omitted.

The barrier thin film layer 160 is formed between the uppermost layer of the encapsulation layer 140, and the touch driving electrode 154 and the touch sensing electrode 152 (not shown), or between the light emitting device 120 and the lowermost layer of the encapsulation layer 140 (shown in FIG. 6). For example, the barrier thin film layer 160 is formed between the cathode 126 and the first inorganic encapsulation layer 142 disposed as the lowermost layer of the encapsulation layer 140. The barrier thin film layer 160 is formed as an inorganic layer that can be formed by atomic layer deposition (ALD) at a low temperature and is formed using an inorganic insulating material such as silicon nitride ($SiN_x$), silicon oxide ($SiO_x$), silicon oxynitride (SiON) or aluminum oxide ($Al_2O_3$). Accordingly, the barrier thin film layer 160 prevents permeation of exterior moisture or oxygen into the light emitting device 120, which is vulnerable to exterior moisture or oxygen, thereby omitting an additional touch barrier layer. In addition, the barrier thin film layer 160 is formed by low-temperature deposition, thus preventing damage to the light emitting stack 124, which is vulnerable to high temperature.

Figure 7A:
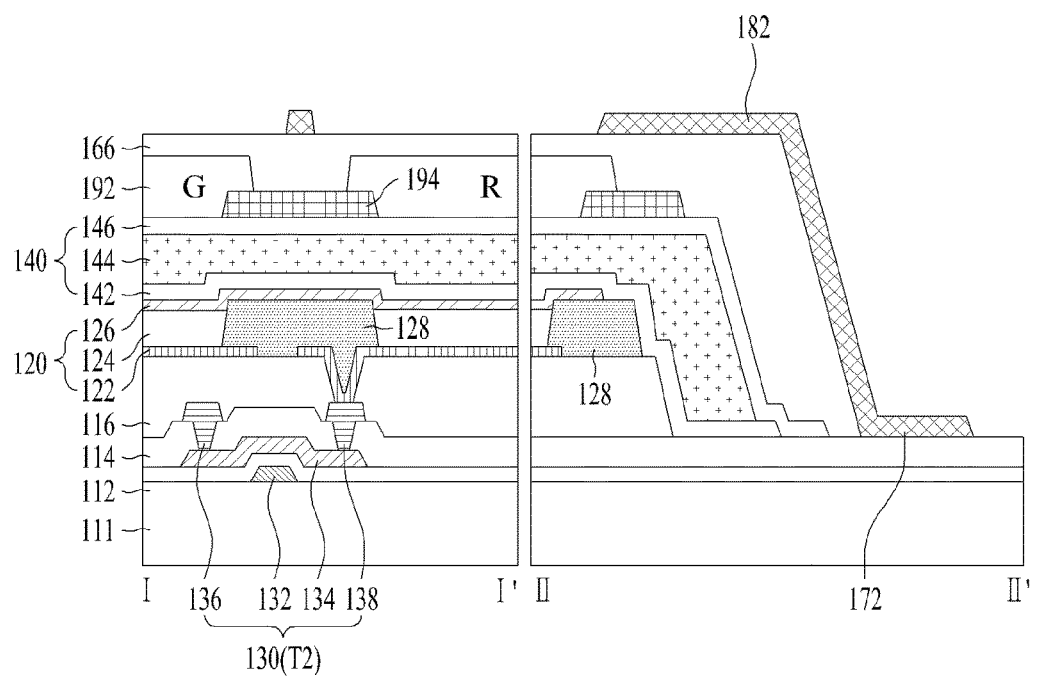
FIGS. 7A to 7B are sectional views illustrating a method of manufacturing the organic light emitting display device with a touch sensor shown in FIG. 4.
Figure 7B:
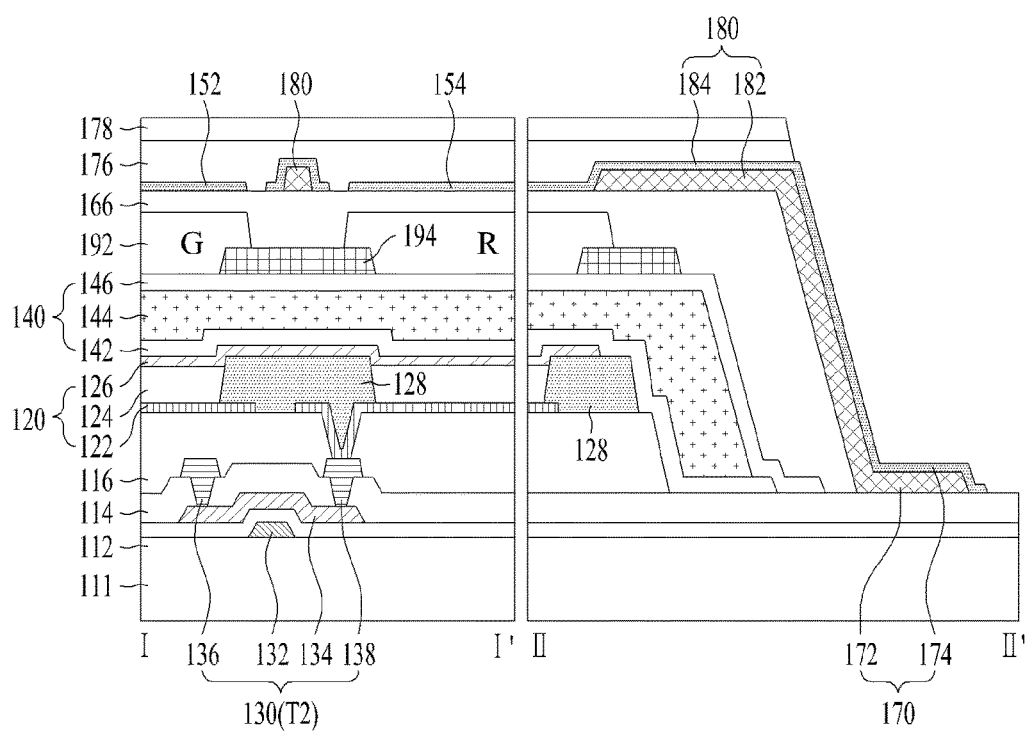

FIGS. 7A to 7B are sectional views illustrating a method of manufacturing organic light emitting display devices with a touch sensor according to first to fourth embodiments of the present disclosure. Herein, the structure of the second embodiment according to the present disclosure illustrated in FIG. 4 will be described as an example.

Referring to FIG. 7A, a first routing layer 182 of the routing line and a pad electrode 172 are formed on a substrate 111 provided with a switching transistor, a driving transistor 130, a light emitting device 120, a encapsulation layer 140, a black matrix 194, a color filter 192 and a touch buffer layer 166.

Specifically, a first conductive layer is deposited at room temperature by deposition using sputtering over the entire surface of the substrate 111 provided with the switching transistor, the driving transistor, the light emitting device 120, the encapsulation layer 140, the black matrix 194, the color filter 192 and the touch buffer layer 166, and the first conductive layer is then patterned by photolithography and etching using a first mask to form the first routing layer 182 of the routing line and the pad electrode 172. Here, the first conductive layer is formed as a monolayer or multilayer structure using a metal with excellent corrosion resistance and acid resistance, such as Al, Ti, Cu, or Mo. For example, the first conductive layer is formed as a three-layer stack structure such as Ti/Al/Ti or Mo/Al/Mo.

Referring to FIG. 7B, a touch driving electrode 154, a touch sensing electrode 152, a second routing layer 184 of the routing line and a pad cover electrode 174 are formed on the substrate 111 provided with the first routing layer 182 of the routing line and the pad electrode 172.

Specifically, a second conductive layer is deposited over the entire surface of the substrate 111 provided with the first routing layer 182 of the routing line and the pad electrode 172. Here, in a case in which a transparent conductive layer, such as ITO or IZO, is used as the second conductive layer, the transparent conductive layer is formed at room temperature by deposition such as sputtering. Then, the second conductive layer is patterned by photolithography and etching using a second mask to form the touch driving electrode 154, the touch sensing electrode 152, the second routing layer 184 of the routing line and the pad cover electrode 174. Then, a touch barrier film 176 and an optical film 178 are attached to the substrate 111 provided with the touch driving electrode 154, the touch sensing electrode 152, the second routing layer 184 of the routing line and the pad cover electrode 174.

Figure 8:
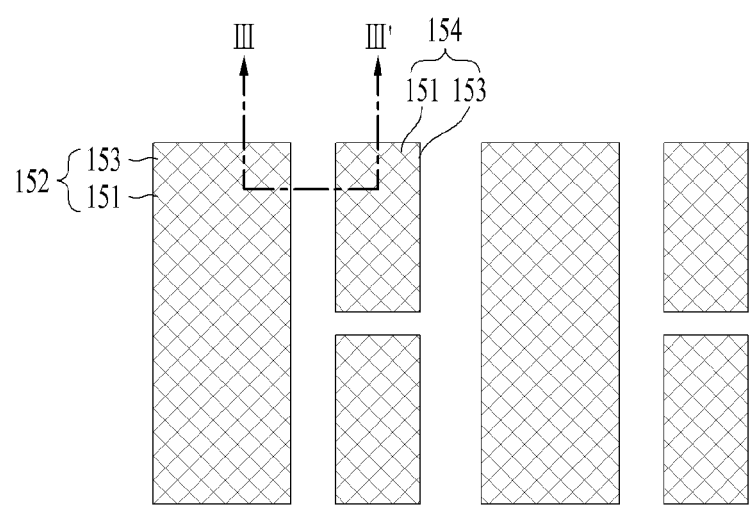
FIG. 8 is a sectional view illustrating a touch sensing electrode and a touch driving electrode according to another embodiment of the present disclosure.
Figure 9A:
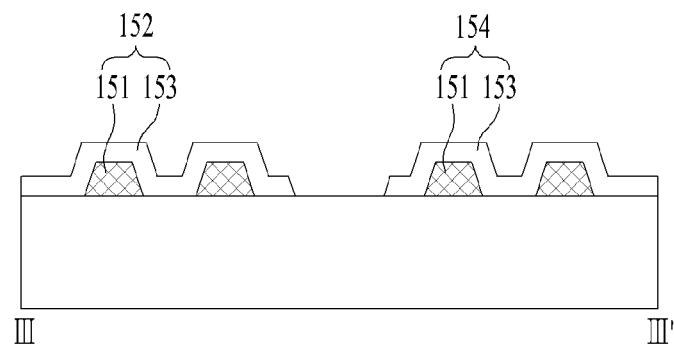
FIGS. 9A and 9B are sectional views illustrating the organic light emitting display device with a touch sensor taken along line "III-III'" of FIG. 8.
Figure 9B:
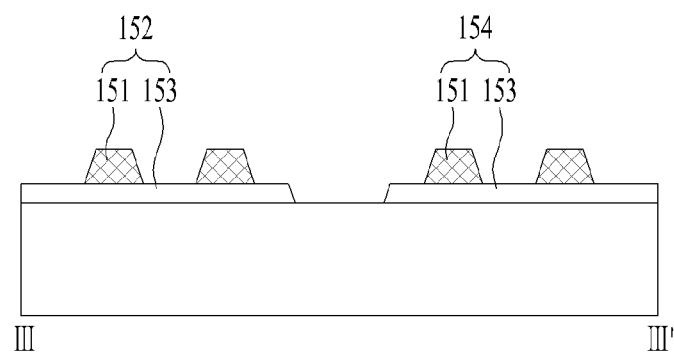

FIG. 8 is a plan view and FIGS. 9A and 9B are sectional views illustrating an organic light emitting display device with a touch sensor according to a fifth embodiment of the present disclosure.

The organic light emitting display device illustrated in FIG. 8 includes the same elements as the organic light emitting display device illustrated in FIGS. 3 to 6, except that the configurations of the touch driving electrode 154 and the touch sensing electrode 152 are changed. Accordingly, detailed description of the same elements will be omitted.

Some layers of the touch driving electrode 154 and the touch sensing electrode 152 illustrated in FIG. 8 may be formed to have a mesh shape. That is, the touch driving electrode 154 and the touch sensing electrode 152 include a transparent conductive layer 153, and a mesh metal layer 151 having a mesh shaped pattern. The mesh metal layer 151 is on or under the transparent conductive layer 153. The mesh metal layer 151 is formed by the same mask process as the first routing layer 182 of the routing line 180 using the same material as the first routing layer 182. Accordingly, it is possible to prevent complications in the manufacturing process and to prevent an increase in manufacturing costs.

In addition, the touch driving electrode 154 and the touch sensing electrode 152 may be composed of only the mesh metal layer 151 without the transparent conductive layer 153, or may be formed of the transparent conductive layer 153 in the form of a mesh without the mesh metal layer 151. Here, the mesh metal layer 151 may include the touch driving electrode 154 and the touch sensing electrode 152 as low-resistance electrodes due to better conductivity than the transparent conductive layer 153. In particular, when the transparent conductive layer 153 is formed at a low temperature (about 100 degrees Celsius or less) in order to protect the light emitting stack 124, which is vulnerable to high temperatures, the transparent conductive layer 153 cannot obtain high transparency and low resistance. In this case, transmittance can be improved by forming the transparent conductive layer 153 to a small thickness while reducing resistance of the touch driving electrode 154 and the touch sensing electrode 152 through the mesh metal layer 151, which has high conductivity.

Accordingly, touch sensitivity can be improved due to decreased resistance and capacitance of the touch driving electrode 154 and the touch sensing electrode 152, and thus a RC time constant is reduced. In addition, deterioration in opening ratio and transmittance resulting from a very small line width of the mesh metal layer 151 can be prevented.

As apparent from the afore-going, the organic light emitting display device with a touch sensor according to an embodiment of the present disclosure has a structure in which touch electrodes are formed on the encapsulation layer. Accordingly, as compared to a conventional organic light emitting display device in which the touchscreen is attached to the organic light emitting display device by an adhesive agent, an embodiment of the present disclosure does not require a joining process, thus simplifying the manufacturing process, reducing manufacturing costs, making the display easier to fold, and improving resolution and opening ratio.

In addition, the organic light emitting display device with a touch sensor according to an embodiment of the present disclosure has a structure in which color filters are formed on the encapsulation layer. Accordingly, an embodiment of the present disclosure does not require a joining process, thus simplifying the manufacturing process, reducing manufacturing costs, making the display easier to fold, and improving resolution and opening ratio.

In addition, in accordance with the organic light emitting display device with a touch sensor according an embodiment of to the present disclosure, touch sensing electrodes and touch driving electrodes are disposed in parallel on the same plane and routing lines are formed by two mask processes in total, thus simplifying a manufacturing process and reducing manufacturing costs.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device, comprising:
at least one light emitting device located on a substrate;
an encapsulation layer located on the at least one light emitting device;
an insulating layer between the substrate and the encapsulation layer; a touch sensor comprising:
a plurality of touch sensing electrodes on the encapsulation layer, the plurality of touch sensing electrodes disposed along a first direction, wherein a length of each touch sensing electrode along the first direction is longer than a length of the touch sensing electrode along a second direction different from the first direction; and
a plurality of touch driving electrodes on the encapsulation layer and in a same plane as the plurality of touch sensing electrodes, the plurality of touch driving electrodes disposed along the first direction and in parallel with the plurality of touch sensing electrodes;
a portion of a routing line on the encapsulation layer, the routing line disposed between a column of touch sensing electrodes and a column of touch driving electrodes, wherein the routing line includes a first part extending from a corresponding touch sensing electrode in the second direction, and a second part extending from the first part in the first direction, and wherein the first part and the second part of the routing line are disposed between the column of touch sensing electrodes and the column of touch driving electrodes, and are in a same layer as the plurality of touch sensing electrodes and the plurality of touch driving electrodes;
a bank disposed under the encapsulation layer, wherein the portion of the routing line disposed between the column of touch sensing electrodes and the column of touch driving electrodes overlaps with the bank, the bank disposed between a pair of sub-pixels to define light emitting regions, wherein the bank is disposed under a region between the column of touch sensing electrodes and the column of touch driving electrodes; and a touch pad electrically connected to the touch sensor and in contact with the insulating layer.

2. The display device of claim 1, wherein the routing line electrically connects the touch pad to the touch sensor, and wherein a portion of the routing line covers a side surface of the encapsulation layer.

3. The display device of claim 2, wherein a portion of the routing line is in contact with the side surface of the encapsulation layer.

4. The display device of claim 2, further comprising: a touch buffer layer between the encapsulation layer and the touch sensor, wherein a portion of the routing line covers a side surface of the touch buffer layer.

5. The display device of claim 1, further comprising:
a color filter between the encapsulation layer and the touch sensor.

6. The display device of claim 1, further comprising: the touch sensor on a color filter, wherein the color filter is disposed between the touch sensor and the encapsulation layer.

7. The display device of claim 1, further comprising: a black matrix located between adjacent sub-pixel regions of a color filter, wherein the routing line is electrically connected to the touch sensor and partially overlaps with the black matrix.

8. The display device of claim 1, wherein at least one of the touch sensing electrodes and the touch driving electrodes comprises:
a mesh metal layer have a mesh shaped pattern; and
a transparent conductive layer located on or under the mesh metal layer.

9. The display device of claim 1, wherein the at least one light emitting device comprises:
an anode disposed on the substrate;
a cathode; and
at least one light emitting stack disposed between the anode and the cathode.

10. The display device of claim 1, wherein the touch pad comprises a pad electrode and a pad cover electrode on the pad electrode.

11. The display device of claim 1, wherein two or more touch driving electrodes in the plurality of touch driving electrodes correspond to a touch sensing electrode in the second direction.

12. A display device, comprising:
at least one light emitting device disposed on a substrate;
an encapsulation layer disposed on the at least one light emitting device;
a touch sensor comprising:
a plurality of touch sensing electrodes on the encapsulation layer, the plurality of touch sensing electrodes disposed along a first direction, wherein a length of each touch sensing electrode along the first direction is longer than a length of the touch sensing electrode along a second direction different from the first direction; and
a plurality of touch driving electrodes on the encapsulation layer and in a same plane as the plurality of touch sensing electrodes, the plurality of touch driving electrodes disposed along the first direction and in parallel with the plurality of touch sensing electrodes;
a routing line electrically connected to the touch sensor, a portion of the routing line disposed between a column of touch sensing electrodes and a column of touch driving electrodes, and a portion of the routing line covering a side surface of the encapsulation layer, and
a bank disposed under the encapsulation layer, wherein the portion of the routing line disposed between the column of touch sensing electrodes and the column of touch driving electrodes overlaps with the bank, the bank disposed between a pair of sub-pixels to define light emitting regions, wherein the bank is disposed under a region between the column of touch sensing electrodes and the column of touch driving electrodes; and wherein the at least one of the touch sensing electrodes and the touch driving electrodes comprises a mesh metal layer having a mesh shaped pattern, and wherein the routing line includes a first part extending from a corresponding touch sensing electrode in the second direction, and a second part extending from the first part in the first direction, and wherein the first part and the second part of the routing line are disposed between the column of touch sensing electrodes and the column of touch driving electrodes, and are in a same layer as the mesh metal layer using a same material as the mesh metal layer.

13. The display device of claim 12, wherein a portion of the routing line is in contact with the side surface of the encapsulation layer.

14. The display device of claim 12, further comprising:
a color filter between the encapsulation layer and the touch sensor.

15. The display device of claim 12, wherein at least one of the touch sensing electrodes and the touch driving electrodes further comprises:
a transparent conductive layer located on or under the mesh metal layer.

16. The display device of claim 12, wherein the at least one light emitting device comprises:
an anode disposed on the substrate;
a cathode; and
at least one light emitting stack disposed between the anode and the cathode.

17. The display device of claim 12, further comprising:
a touch pad electrically connected to the touch sensor, the touch pad comprising a pad electrode and a pad cover electrode on the pad electrode.

18. The display device of claim 12, wherein two or more touch driving electrodes in the plurality of touch driving electrodes correspond to a touch sensing electrode in the second direction.

19. A display device, comprising:
at least one light emitting device located on a substrate;
an encapsulation layer located on the at least one light emitting device;
an insulating layer between the substrate and the encapsulation layer;
a touch sensor comprising:
a plurality of touch sensing electrodes on the encapsulation layer, the plurality of touch sensing electrodes disposed along a first direction; and
a plurality of touch driving electrodes on the encapsulation layer and in a same plane as the plurality of touch sensing electrodes, the plurality of touch driving electrodes disposed along the first direction and in parallel with the plurality of touch sensing electrodes;
a color filter on the encapsulation layer, wherein at least a part of the color filter is on or under the touch sensor;
a portion of a routing line on the encapsulation layer, the routing line disposed between a column of touch sensing electrodes and a column of touch driving electrodes, wherein the routing line includes a first part extending from a corresponding touch sensing electrode in a second direction different from the first direction, and a second part extending from the first part in the first direction, and wherein the first part and the second part of the routing line are disposed between the column of touch sensing electrodes and the column of touch driving electrodes, and are in a same layer as the plurality of touch sensing electrodes and the plurality of touch driving electrodes;

a bank disposed under the encapsulation layer, wherein the portion of the routing line disposed between the column of touch sensing electrodes and the column of touch driving electrodes overlaps with the bank, the bank disposed between a pair of sub-pixels to define light emitting regions, wherein the bank is disposed under a region between the column of touch sensing electrodes and the column of touch driving electrodes; and a touch pad electrically connected to the touch sensor and in contact with the insulating layer.

* * * * *